United States Patent
Michaud et al.

(10) Patent No.: US 7,534,145 B1
(45) Date of Patent: May 19, 2009

(54) DESIGN AND METHOD FOR PLATING PCI EXPRESS (PCIE) EDGE CONNECTOR

(75) Inventors: Bruce Michaud, Clayton, CA (US); Peter Ammann, San Jose, CA (US); George Sorenson, Fremont, CA (US)

(73) Assignee: nVidia Corporation, Santa Clara, CA (US)

( * ) Notice: Subject to any disclaimer, the term of this patent is extended or adjusted under 35 U.S.C. 154(b) by 54 days.

(21) Appl. No.: 11/636,301

(22) Filed: Dec. 7, 2006

Related U.S. Application Data

(62) Division of application No. 10/836,576, filed on Apr. 30, 2004, now Pat. No. 7,192,312.

(51) Int. Cl.
H01R 24/00 (2006.01)
(52) U.S. Cl. .................................................... 439/633
(58) Field of Classification Search ............... 439/633; 438/106–110, 113, 127, 618
See application file for complete search history.

(56) References Cited

U.S. PATENT DOCUMENTS

| | | | | |
|---|---|---|---|---|
| 4,562,301 A | * | 12/1985 | Kameda et al. | 174/265 |
| 5,407,365 A | * | 4/1995 | Lin | 439/636 |
| 5,437,777 A | * | 8/1995 | Kishi | 204/224 R |
| 6,027,632 A | * | 2/2000 | Knall et al. | 205/640 |
| 6,302,700 B1 | | 10/2001 | Puri et al. | |
| 6,319,418 B1 | | 11/2001 | Verdeflor et al. | |
| 6,428,360 B2 | | 8/2002 | Hassanzadeh et al. | |
| 6,520,805 B2 | | 2/2003 | Hassanzadeh et al. | |
| 6,562,709 B1 | * | 5/2003 | Lin | 438/618 |
| 6,660,626 B1 | * | 12/2003 | Lin | 438/618 |
| 6,701,400 B2 | | 3/2004 | Hayes et al. | |
| 6,736,660 B2 | | 5/2004 | Ku | |
| 6,848,927 B2 | | 2/2005 | Shirai | |

* cited by examiner

*Primary Examiner*—Jean F Duverne
(74) *Attorney, Agent, or Firm*—Berkeley Law & Technology Group, LLP

(57) ABSTRACT

Embodiments of methods and apparatus for plating a PCI Express edge connector are described. In one embodiment, a printed circuit board having connectors is employed for electroplating one or more of the connectors formed thereon. The printed circuit board comprises a substrate having one or more layers, and a plurality of connectors formed on one or more of the layers, wherein at least one connector includes at least one short pin and at least one extra pin. The at least one extra pin extends beyond an outer shape of the printed circuit board after fabrication. The printed circuit board also includes connection circuitry formed on one or more of the layers, wherein the connection circuitry is configured to electrically connect the short pin with the extra pin at least during electroplating of said short pin.

13 Claims, 3 Drawing Sheets

DESIGN AND METHOD FOR PLATING PCI EXPRESS (PCIE) EDGE CONNECTOR

CROSS-REFERENCE TO RELATED APPLICATIONS

This is a Divisional patent application of U.S. patent application Ser. No. 10/836,576, filed Apr. 30, 2004 now U.S. Pat. No. 7,192,312.

BACKGROUND

In a variety of electrical or electronic devices, an electrical or electronic assembly is included such as, for example, motherboards, graphics cards, processor cards, network interface cards, sound cards, other peripheral cards and the like. Typically, such electrical assemblies include one or more circuit boards, such as printed circuit boards (PCBs). Such PCBs are often manufactured to have a particular electrical layout for a set of electronic components to together form the electrical or electronic assembly. Electronic components may include, for example, integrated circuit components, such as microprocessors and/or memory devices, but may additionally include other electrical components such as resistors, capacitors, and/or connectors, such as input/output (I/O) connectors, as just a few examples. A circuit board, such as a PCB, may comprise a number of layers, for example, such as conductive and non-conductive layers, and one or more of the conductive layers may include one or more conductive features, such as traces, pins and/or pads, for example.

Numerous techniques are employed when fabricating or manufacturing a circuit board, such as a PCB. One such technique includes electroplating to form one or more electrically conductive surfaces in desired locations of the board or the assembly. However, depending at least in part on the location to be electroplated, it may be time consuming and/or expensive to employ such a process. Techniques for electroplating that are quicker, less expensive and/or less labor intensive continue to be desired.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION

Figure 1:
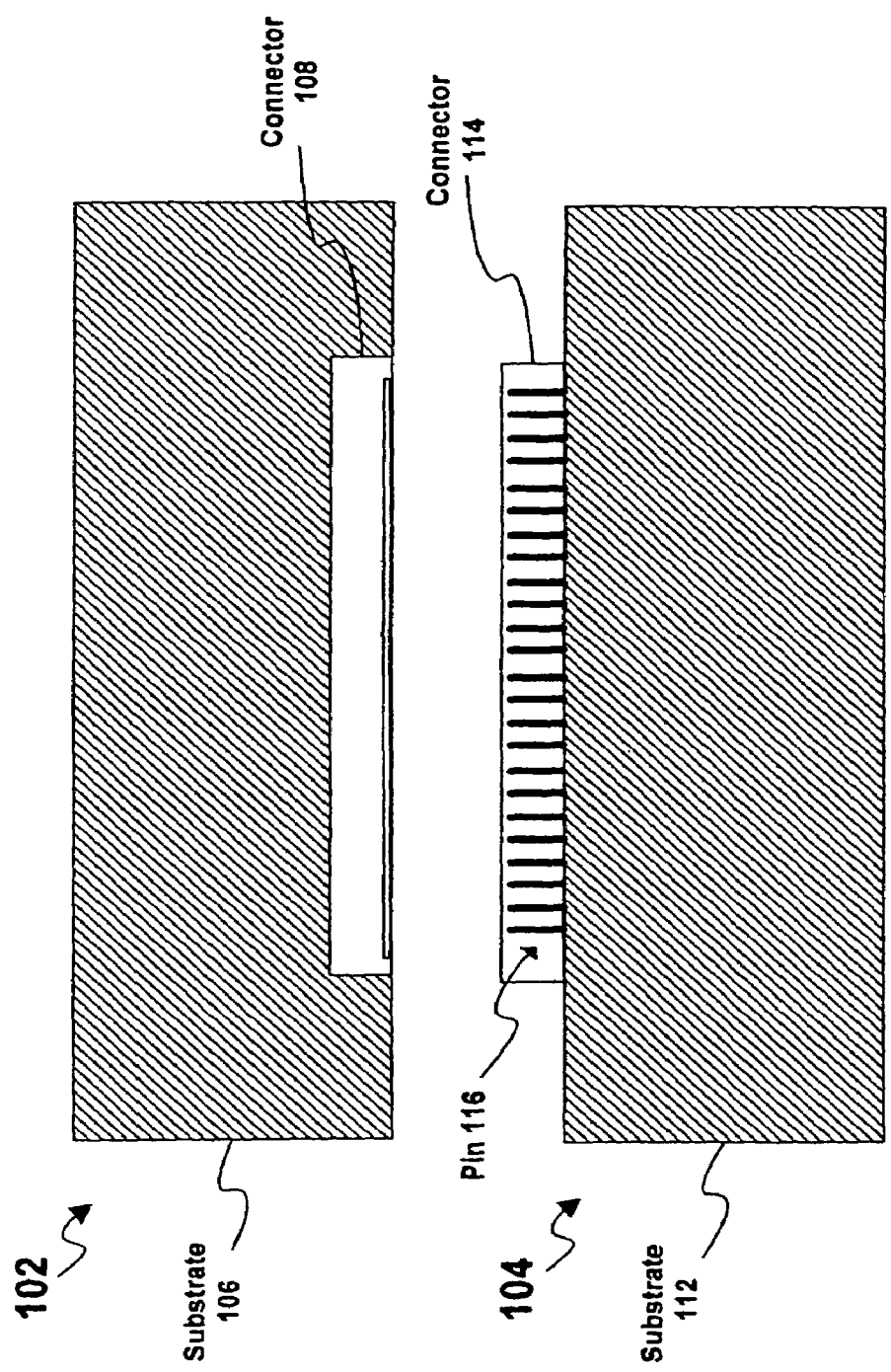
FIG. 1 is a schematic diagram illustrating an embodiment of two circuit boards manufactured so as to interconnect.

In the following detailed description, numerous specific details are set forth to provide a thorough understanding of the claimed subject matter. However, it will be understood by those skilled in the art that the claimed subject matter may be practiced without these specific details. In other instances, well-known methods, procedures, components and/or circuits have not been described in detail so as not to obscure the claimed subject matter.

As previously suggested, an electrical or electronic assembly may comprise one or more electrical or electronic components coupled to a substrate, such as a circuit board. A printed circuit board (PCB), for example, may comprise one or more layers, which may comprise laminated layers, for example, and may include conductive and/or non-conductive layers. Likewise, one or more of the conductive layers may include one or more conductive features formed thereon, for example. Additionally, an electronic assembly may comprise one or more electronic components, including, for example, integrated circuit (IC) components, such as one or more microprocessors, graphics processing units (GPUs), digital signal processors (DSPs), one or more memory devices, one or more application specific integrated circuits (ASICs), and may include other types of electronic components, such as capacitors, resistors, and/or connectors including input/output (I/O) connectors for coupling to external circuitry, such as bus circuitry, for example. Of course, these are simply examples and the claimed subject matter is not limited in scope to these examples.

In at least one example, one or more electronic assemblies may be coupled to form an electronic device. Examples of electronic devices may include, for example, computers, including desktop computers, laptop computers, servers, switches, and/or hubs, handheld devices, including digital cameras and/or cellular telephones, and may additionally include peripheral devices, including printers, monitors, and/or scanners, for example. Those skilled in the art will recognize, however, that the claimed subject matter is again not limited to these particular examples.

As indicated above, in at least one particular embodiment, a circuit board, such as a PCB, may comprise a plurality of layers. In this context, the term circuit board refers to a substrate comprising one or more layers manufactured so as to have one or more electronic components assembled with it to form an electrical or electronic circuit. Typically, for example, the components are attached to such a substrate. Likewise, a printed circuit board comprises a circuit board in which at least a portion of at least one of the layers of the substrate includes printed conductive traces for forming one or more such circuits.

In at least one particular embodiment, for example, a circuit board, such as a PCB, may comprise one or more layers of non-conductive material interleaved and/or laminated with one or more conductive circuit patterns and/or one or more additional layers, for example. In this embodiment, although the claimed subject matter is not so limited, one or more non-conductive layers of material may include, for example, one or more resins, such as epoxy resins, polymer resins and/or phenolic resins, fibrous material, such as fiberglass, and/or other materials including glass, plastic, carbon, polyimides, polytetrafluoroethylene (PTFE), ceramic and/or quartz, as just a few examples. These non-conductive layers of material may, when assembled to form a substrate, be at least partially interleaved with one or more conductive layers, such as one or more layers of conductive circuit patterns, which may additionally be referred to as traces and/or signal layers, one or more ground planes and/or power plane layers, and/or one or more pins and/or pads, for example.

A conductive layer may comprise a layer at least partially comprising metal, wherein the metal may be selectively patterned to provide one or more interconnections between one or more components and/or one or more particular conductive features of the substrate, such as one or more pads and/or connectors, for example, and may be formed on one or more surfaces of one or more substrate layers, such as a top surface, for example. Although the claimed subject matter is not so limited, such conductive features may include or be formed from one or more types of conductive material, including, for example, copper, gold, silver, platinum, tin, aluminum, palladium, nickel, and/or any combinations thereof. Of course, again, the claimed subject matter is not so limited, and may at least partially comprise any conductive and/or semi-conductive material, for example. Additionally, methods for forming one or more conductive features may vary, and the claimed subject matter is not limited to any particular method of forming conductive features, as explained in more detail hereinafter.

As suggested previously, one or more electronic components of an electronic assembly may be electrically connected to one or more other components of the electronic assembly by a hierarchy of electrically conductive paths, such as traces. In at least one particular embodiment, one or more conductive layers may be coupled to one or more additional other conductive layers by use of one or more vias. In this context, the term via refers to a hole that is formed between one or more layers of a substrate. In one potential embodiment, such vias may subsequently be plated with conductive material, for example. Thus, one particular example of a via includes a plated through hole (PTH). Such PTHs may provide interconnection between one or more conductive layers, such as between one or more circuits. This, therefore, may result in the formation of a substantially electrically continuous circuit spanning one or more layers of a substrate, as just an example.

In the manufacture of a particular electrical or electronic device, it may be desirable to have the ability to interconnect one or more circuit boards or PCBs, for example. Typically, this may be accomplished by use of one or more I/O connectors, which may provide interconnection between one or more electronic components, one or more buses, and/or one or more electronic assemblies, for example. The board, for example, may be formed to have one or more I/O connectors, such as one or more slots, and/or one or more pins, such as an array of pins, for example. The one or more pins, in at least one embodiment, may be configured to be removably and/or permanently coupled to one or more slots of one or more such boards. In this context, electrically and physically interconnecting one or more electronic assemblies formed on circuit boards to one or more additional electronic assemblies formed on circuit boards may be referred to as plugging. For at least one circuit board, for example, a connector may be formed on the board, and may be adapted to be removably plugged into one or more slots, such as one or more slots formed on one or more additional boards, for example.

Connectors as described previously, such as pins and/or slots, for example, may be compatible and/or compliant with a particular connector protocol. Such a particular connector protocol may specify mechanical and/or electrical specifications for the one or more connectors. For example, connectors that are configured to be removably plugged into a slot in accordance with a particular connector protocol, for example, may have particular plating and/or finish specifications. A specification for such a connector protocol may, for example, detail particular materials suitable for forming such connectors, and/or may additionally specify particular thicknesses as well as other aspects of the connectors, for example. Although the claimed subject matter is not so limited, well-known examples of such specifications may include Accelerator Graphics Port (AGP) specification, Peripheral Component Interconnect (PCI) specification, and/or Peripheral Component Interconnect Express (PCI-Express) specification, also referred to as the $3^{rd}$ Generation Input/Output (3GIO), for example. AGP has been defined by Intel Corporation of Santa Clara, Calif. under specification 3.0, revision 1.0, adopted September, 2002; The PCI specification has been defined by the PCI special interest group (PCISIG), conventional PCI specification revision 3.0, adopted Apr. 19, 2004; additionally, the PCI-Express specification has been defined by PCISIG, specification revision 1.0, adopted Jul. 16, 2002. More information may be obtained on the Internet at the following URL: http://www.pcisig.com, and/or the following address: 5440 SW Westgate Drive #217, Portland, Oreg. 97221.

One example of a manufacturing or fabrication process employed in the manufacture of a circuit board or PCB, particularly those that may include connectors, as previously described, includes the process of electroplating. In this context, the term electroplating refers to a process in which coating and/or plating is deposited by electrodeposition, also referred to here as electrolytic plating. Electroplating processes may prove desirable in this context at least in part because it may produce a coating and/or plating that is relatively, thick, dense and/or may prove relatively resistant to wear, such as may occur from the use of connectors and the like. Typically, for example, as will be explained in more detail later, one or more connectors, such as pins, may be formed from a particular conductive material. A subsequent process may then form one or more additional materials on at least a portion of the connector, such as one or more plating layers of material, for example. Thus, forming one or more additional material layers may comprise one or more plating processes, such as one or more electroplating processes. Of course, the claimed subject matter is not limited in scope to electroplating or to forming layers that are either dense or resistant to wear. These are simply examples of possible manufacturing considerations that may arise in the fabrication of a circuit board.

Of course, numerous techniques and/or materials may be utilized to form one or more boards, and, again, the claimed subject matter is not limited to any particular materials or techniques. However, in one particular embodiment, a substrate layer may be formed, and may comprise a non-conductive layer, such as a layer substantially comprising epoxy resin, polymer resin and/or phenolic resin, for example. The layer may be formed from a rolling, extruding, molding, pressing and/or machining process, as just a few examples, and may be formed to have particular dimensions. One or more conductive layers may be formed on one or more surfaces of the substrate layer, such as one or more layers of conductive material, including a layer of copper foil, for example. The one or more conductive layers may be formed on one or more sides of the substrate layer by use of one or more forming processes, such as one or more deposition, layering, and/or rolling processes, for example. In one embodiment, when a layer of conductive material is formed on one or more layers of a substrate layer, at least a portion of the conductive material may be selectively removed, such as to form one or more conductive features, such as one or more traces, pads, pins, and/or portions of circuitry, for example. This may be referred to as etching, although, the claimed subject matter is not so limited. Additionally, one or more electronic or electrical components may be coupled electrically and/or physically to the multilayer substrate, such as by soldering, including reflow soldering, for example, and may be coupled by use of one or more solder ball or bump arrays, for example (not shown). Additionally, one or more portions of the multilayer substrate may be selectively removed, such as to form a connector having a particular connector profile, such as the connectors illustrated in FIGS. 1 and/or 2, for example. In this embodiment, selective removal of the substrate material may be performed by one or more mechanical processes, such as one or more routing, honing, cutting, beveling and/or grinding processes, although, again, the claimed subject matter is not so limited.

One or more additionally forming processes may be performed on one or more conductive features, such as after one or more substrates are formed into a multilayer substrate, and/or before removal of at least a portion of the substrate material, for example, although the claimed subject matter is not limited in this respect. In one embodiment, for example, as previously suggested, one or more plating processes may be performed on one or more conductive features, such as one or more electrical contacts of a connector, for example. Although the claimed subject matter is not so limited, in one embodiment, one or more plating processes, such as electrolytic and/or electroless plating, may be performed on at least a portion of one or more conductive features of one or more substrate layers. Thus, one or more plating processes may be performed on one or more connectors.

For example, a connector, such as one or more pins, may be formed from a particular material or combination of materials, such as a copper alloy, for example. One or more of the pins may be formed from one or more deposition and/or etching processes, such as by forming a layer of copper foil on a substrate, and selectively removing portions of the foil to form one or more pins, for example. Likewise, as previously suggested, it may be desirable to increase the thickness of a conductive material used to form one or more connectors, and/or the durability of the connectors, although the claimed subject matter is not limited in scope in this respect. For example, a plating process, such as electroplating, may be employed. In one particular embodiment, an array of pins, such as illustrated on substrate 122, for example, may be plated, such as by electroplating.

In one particular embodiment, although the claimed subject matter is not so limited, a substrate may be formed with one or more pins or other electrical contacts, and the one or more pins or other contacts may be formed from a particular material, such as copper, and may be formed to a particular thickness, such as a thickness substantially within the range of approximately 100-200 microinches (μin), such as approximately 150 μin, for example. The one or more pins or other contacts may, for example, be formed from one or more of the aforementioned processes, such as one or more deposition and/or etching processes, for example. One more additional deposition processes, such as one or more plating processes, may be performed. For example, one or more pins or other contacts may be at least partially plated with nickel, and may be formed to a particular thickness, such as a thickness substantially within the range of approximately 15-45 μin, such as to a thickness of approximately 30 μin, for example. Additionally, one or more additional plating processes may be performed, and the one or more plated pins or other contacts may be at least partially plated with gold, and may be formed to a particular thickness, such as a thickness substantially within the range of approximately 15-45 μin, such as to a thickness of approximately 30 μin, for example. These one or more plating processes may comprise one or more electroplating processes, for example, although the claimed subject matter is not so limited. Additionally, although specific plating thicknesses and materials are described, the claimed subject matter is not limited to any particular plating thickness and/or material, for example.

Referring now to FIG. 1, a schematic diagram of an embodiment of two circuit boards, 102 and 104 respectively, is shown. As illustrated, and described in more detail below, in this embodiment, one or more connectors are formed on these particular circuit boards. Furthermore, these circuit boards are manufactured to interconnect via connectors 108 and 114. Illustrated as part of these boards are connectors 108 and 114, which may have a plurality of electrical contacts formed thereon. For this embodiment, these electrical contacts are illustrated as a slot and corresponding pins or fingers, although, the claimed subject matter is not limited in scope in this respect. Electrical contacts for a connector may take any one of a variety of forms, including, without limitation, extensions, pins, fingers, ports, terminals and the like. In general, any type of electrical contact now known or later developed, regardless of, for example, geometry, material, location, and conductivity, is included within the scope of the claimed subject matter.

Circuit board 102, in this embodiment, comprises a substrate 106 with a connector 108 formed thereon. As previously suggested, substrate 106 may comprise one or more layers, such as one or more conductive and/or nonconductive layers, for example (not shown), and may comprise laminated layers, for example. Connector 108, in this particular embodiment, comprises a slot and may be referred to as an I/O slot connector. Connector 108 may provide electrical connectivity between one or more components (not shown) to be assembled with substrate 106, such as one or more buses and/or one or more IC components, for example. Circuit board 104, in this embodiment, comprises a substrate 112 with a connector 114 formed thereon. Connector 114 in this embodiment comprises an array of pins, such as pin 116, and may be referred to as an I/O pin array connector. Of course, these are simply examples of an I/O slot connector and an I/O pin array connector. Thus, the claimed subject matter is not limited in scope to these particular examples.

However, as illustrated, for this particular embodiment, a particular pin pattern or pin out of connector 114 may substantially comprise a mirror image of the connector pattern of connector 108, although, again, this is merely an example. Connector 114 may likewise provide electrical connectivity between one or more components (not shown) to be assembled with substrate 112, such as one or more buses and/or one or more IC components, for example. Furthermore, in at least one embodiment, connector 108 and/or connector 114 may be formed to comply with one or more specifications, such as the aforementioned AGP, PCI, and/or PCI-Express specifications, for example.

Figure 2:
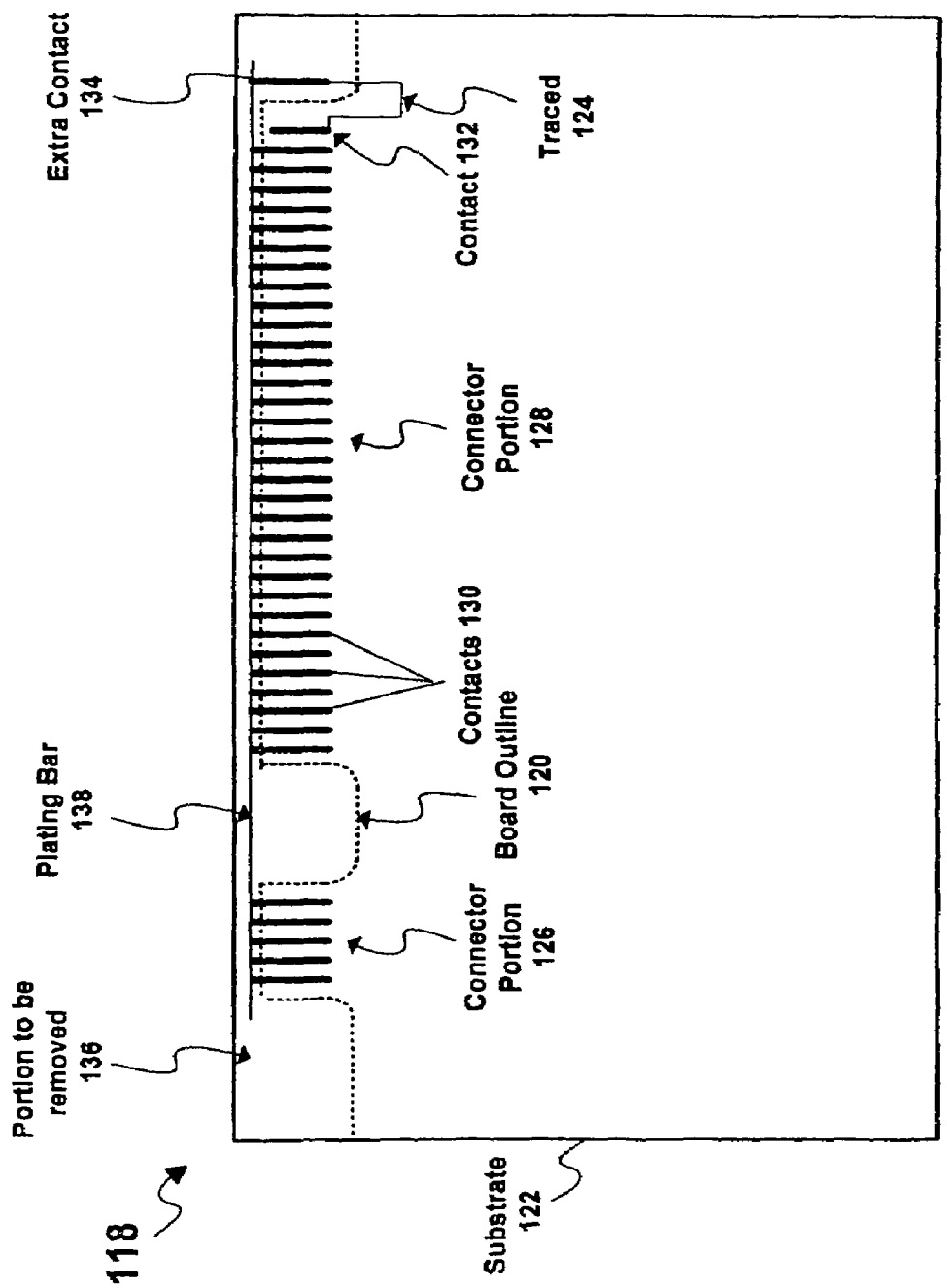
FIG. 2 is a schematic diagram illustrating a portion of another embodiment of a circuit board.

Referring now to FIG. 2, a schematic diagram illustrating a portion of another embodiment of a circuit is provided. Here, FIG. 2 specifically illustrates a partially formed circuit board. Board 118 here comprises a substrate 122. Substrate 122 may comprise one or more layers, such as one or more conductive and/or non-conductive layers, for example (not shown), and/or one or more traces, pads and/or pins, such as pins 130, 132 and 134, for example. Depending upon the particular situation, board 118 may additionally comprise one or more electronic or electrical components, such as, for example, IC components (not shown). For example, circuit board 118 may comprise a PCB for a graphics card, although this is merely one example, and the claimed subject matter is not limited in scope to this particular example.

Illustrated as part of board 118 are connector portions 126 and 128, which may have a plurality of electrical contacts 130 formed thereon, as well as one or more additional electrical contacts such as short contact 132 and extra contact 134. Again, for this embodiment, these electrical contacts are illustrated as pins or fingers that extend from the board, although the claimed subject matter is not limited in scope in this respect. Electrical contacts may take any one of a variety of forms and any type of electrical contact, now known or later developed, is included within the scope of the claimed subject matter.

Additionally illustrated is board outline or outer shape 120, designated by the segmented line. In this context, the term outer shape or outline if applied to a circuit board refers to the shape or outline the board will have after fabrication to produce the board is substantially complete. Additionally illustrated in this particular embodiment is a plating bar 138, which may at least partially comprise conductive material, and may provide a conductive path between one or more pins formed on board 118, for example. Additionally, a trace 124 may be formed on substrate 122. In this particular embodiment, the term trace refers to a conductive path formed on the circuit board. Here, trace 124 provides electrical coupling between two or more electrical contacts, such as between one or more electrical contacts 130 and/or, 132, and extra contact 134, for example. It is noted that here electrical contact 134 extends beyond the outline or outer shape of board 118. Thus, in later fabrication, this extra contact may be removed, as explained in more detail below. Any one of a number of techniques to remove the extra contact may be employed and the claimed subject matter is not limited in scope to a particular approach. For example, the contact may be removed by cutting away a portion of the board substrate, such as in an automated manufacturing operation (routing), for example. Likewise, depending on the placement of the contact relative to the board, the pin may be removed by beveling along the edge of the board, for example, again, such as in an automated manufacturing operation, although, again, these are simply a few of the possible examples.

In one particular embodiment, extra pin 134 may be electrically coupled to one or more pins that are not connected to plating bar 138, for example, such as short pin or contact 132. Although not illustrated for this particular embodiment, it is noted that depending upon the particular circumstances, additional electrical coupling of between various pins, other than pin 134 to pin 132, for example may additionally be accomplished, such as through one or more traces and/or vias in addition to or alternatively to trace 124, and, although not illustrated, the one or more traces and/or vias may be formed on one or more layers of the substrate, for example. Thus, for example, it may be desirable, in some circumstances to include a plurality of extra electrical contacts, such as pins, fingers, or the like, that may be electrically connected to other electrical contacts, and may be removed in later fabrication. As will become more clear hereinafter, such electrical connections may facilitate the electroplating of electrical contacts, such as pins or fingers, for example, that otherwise may be more expensive, time consuming and/or labor intensive to electroplate, for example.

For example, in this embodiment, as illustrated in FIG. 2, an electrical contact of board 118, here pin 132, is shorter in length than other electrical contacts, such as pins 130, for example. In particular, although the claimed subject matter is not limited in scope in this respect, in accordance with the PCI-Express specification, the other pins are a standard length while pins A1 and B81 are shorter than this standard length and are connected in the schematic and by a trace on the actual PCB. If they were not connected in this way an additional pin could be added to facilitate the electroplating of that shorter finger and routed or removed in creating the final board outline. Thus, here, the electrical contacts are formed to comply with the electrical and/or mechanical specifications of the aforementioned PCI-Express specification, although, again, the claimed subject matter is not limited in scope in this respect. For example, the claimed subject matter is not limited to any particular type and/or number of connector portions or pins, any particular pin or contact length and likewise is not limited to a board comprising pins and/or connector portions.

Figure 3:
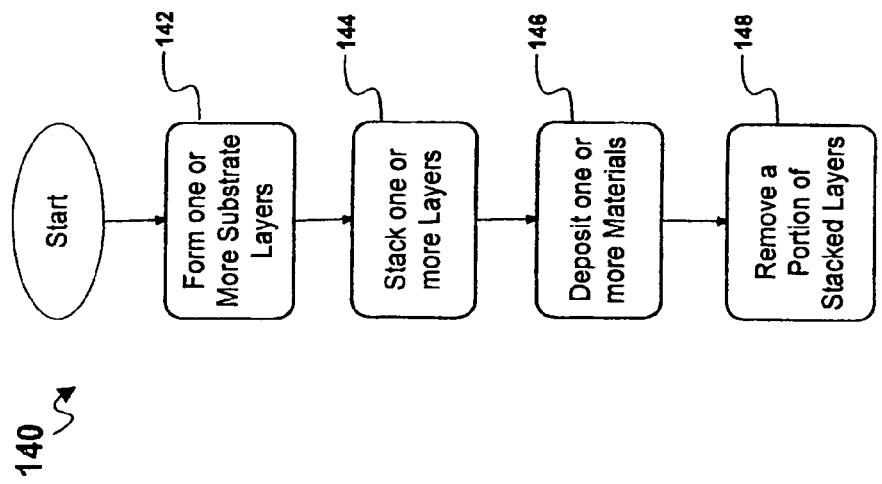
FIG. 3 is a flowchart illustrating an embodiment of a method of manufacturing a circuit board.

In one particular embodiment, a method of making one or more of the aforementioned embodiments is illustrated in FIG. 3. FIG. 3 illustrates a flowchart 140, with numerous blocks. However, the claimed subject matter is not so limited, the order in which the particular operations are presented does not necessarily imply a particular order of operation, and the claimed subject matter may comprise one or more methods comprising one or more of the following operations, and may comprise additional intervening, substitute, and/or subsequent operations. At a high level, one or more substrate layers may be formed as indicated by block 142. At block 144, one or more substrate layers may be stacked. At block 146, one or more additional deposition processes, such as one or more plating processes, may be performed on one or more portions of one or more substrate layers. At block 148, one or more portions of one or more substrate layers may be removed, such as selectively, for example.

More specifically, in this embodiment, one or more substrate layers may be formed as indicated at block 142. A substrate layer, in this embodiment, may comprise a conductive and/or non conductive layer of material, and may comprise one or more materials, such as one or more epoxy resins, polymer resin and/or phenolic resins, and/or one or more types of conductive material, including copper, gold, silver, platinum, tin, aluminum, palladium, nickel, and/or alloys thereof, for example. One or more conductive features may be formed on one or more substrate layers, such as one or more pads, pins, and/or one or more plating bars, for example. Methods of forming one or more substrate layers may vary, but may include, for example, one or more rolling, extruding, molding, pressing and/or machining process, and/or one or more plating, deposition, and/or etching processes, such as mechanical and/or chemical etching, for example.

As indicated at block 144, one or more of the substrate layers formed at block 142 may be at least partially fabricated by stacking one on another. In one embodiment, two or more substrate layers, such as one or more conductive layers and/or one or more non-conductive layers, may be fabricated, and this may comprise laminating, for example, and the two or more layers may be fabricated to at least partially form a circuit, such as illustrated in FIGS. 1 and/or 2, for example. Additionally, as part of the fabrication process of block 144, one or more vias may be formed, and/or one or more electrical or electronic components, such as one or more IC components and/or one or more connectors such as a slot, including a PCI-Express I/O slot, for example, may be coupled to one or more of the substrate layers, for example.

In this embodiment, as indicated at block 146, one or more materials may be deposited. This may include, for example, one or more deposition processes, such as electroplating and/or electroless plating, for example, or may comprise one or more additional types of deposition processes, but the claimed subject matter is not so limited. For example, in one particular embodiment, one or more portions of one or more substrate layers may be provided with material, such as providing one or more connectors with plating material, for example. In this embodiment, one or more connectors, such as one or more contacts, may be formed, such as indicated at block 144, as previously described. The one or more contacts may be provided with one or more additional conductive materials, such as by plating. Thus, in this embodiment, one or more pins or other contacts may be formed from copper, such as copper foil, for example. One or more additional materials, such as nickel and/or gold, for example, may be plated on to at least a portion of the one or more pins or other contacts, such as to a particular thickness or thicknesses, for example.

In this embodiment, electroplating may be utilized to deposit one or more materials, and may be substantially performed in the following manner. One or more pins or other contacts may be provided with electrical energy, such as by coupling a power source to one or more pins or other contacts, such as, for example, via a plating bar, and/or trace, as previously described with respect to FIG. 2. The one or more pins or other electrical contacts being provided with electrical energy may be at least partially provided with an electrolytic solution, such as by being immersed in a solution, for example, and this may result in at least a portion of a material in solution being plated to the one or more pins or other contacts being provided with electrical energy, for example.

In one embodiment, referring now to FIG. 2, one or more pins, such as pins 130, pin 132 and/or pin 134, may be plated, such as by electroplating. In this embodiment, an electrical power source may be provided to one or more of the pins, such as by coupling an electrical lead from the power source to a portion of the one or more pins, such as the outside edge of one or more pins, such as by use of a plating bar, although this is not a requirement. In one embodiment, an electrical lead may be configured to contact the edges of an array of pins, such as pins 130, for example. However, in one embodiment, wherein one or more pins are shorter than a length, such as a standard length, for example, such as pin 132, potentially, for example, the electrical lead and/or the plating bar may not contact the shorter pin, resulting in the shorter pin not being plated, for example. In one embodiment, a pin, such as extra pin 134, may be formed to be electrically coupled to one or more shorter pins, such as by one or more traces, for example, and may be longer than the shorter pins, such as a standard pin length, for example. In this embodiment, an electrical lead may contact pins 130 and extra pin 134, for example, and, thereby, electrical energy may be provided to short pin 132, even though the electrical lead from the power may not be in physical contact with pin 132, for example. Although, of course, this is just one possible embodiment of the claimed subject matter and other potential embodiments are, therefore, not limited in this respect.

In this embodiment, at block 148, one or more portions of the layers may be removed. One or more layers, such as one or more conductive and/or non-conductive layers, may be fabricated into a multilayer substrate, for example. As part of the formation process, as described with respect to block 146, one or more additional processes, such as one or more deposition processes, including electroplating, may be performed on at least a portion of the one or more substrate layers. However, as indicated at this block 148, a portion of the substrate may be removed, to produce a board outline and/or outer shape, such as board outline 120 of FIG. 2, for example. Although numerous methods exist for removing at least a portion of one or more substrate layers, including one or more routing, honing, beveling, cutting, and or grinding processes, in one particular embodiment, a substrate may be formed from a plurality of layers, and one or more portions of one or more layers may be removed by use of one or more routing processes, for example. In one embodiment, removal of one or more portions of a substrate may also remove one more extra electrical contact, such as pins, that were previously employed in connection with an electroplating process, for example.

It will, of course, also be understood that, although particular embodiments have just been described, the claimed subject matter is not limited in scope to a particular embodiment or implementation. In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. A method of manufacturing a printed circuit board comprising:
   forming one or more substrate layers;
   forming one or more printed circuit layouts on said one or more substrate layers;
   forming one or more connectors on said one or more substrate layers, wherein at least one of said one or more connectors is electrically coupled to at least one of said one or more printed circuit layouts; said at least one connector including an extra pin extending beyond an outer shape of said printed circuit board following manufacturing; and
   applying electrical energy to said extra pin so as to deposit a metal surface upon a portion of said at least one connector.

2. The method of claim 1, wherein the extra pin has substantially the same length as at least one of the one or more connectors.

3. The method of claim 1, wherein said printed circuit board following manufacturing comprises a graphics card.

4. A method of manufacturing a printed circuit board comprising:
   forming one or more substrate layers;
   forming one or more printed circuit layouts on said one or more substrate layers;
   forming one or more connectors on said one or more substrate layers wherein at least one of said one or more connectors is electrically coupled to at least one of said one or more printed circuit layouts; said at least one connector including an extra pin extending beyond an outer shape of said printed circuit board following manufacturing;
   applying electrical energy to said extra pin so as to deposit a metal surface upon a portion of said at least one connector, and wherein said portion of said at least one connector comprises a pin shorter than said extra pin.

5. A method of manufacturing a printed circuit board comprising:
   forming one or more substrate layers;
   forming one or more printed circuit layouts on said one or more substrate layers;
   forming one or more connectors on said one or more substrate layers, wherein at least one of said one or more connectors is electrically coupled to at least one of said one or more printed circuit layouts; said at least one connector including an extra pin extending beyond an outer shape of said printed circuit board following manufacturing;

applying electrical energy to said extra pin so as to deposit a metal surface upon a portion of said at least one connector; and removing a portion of said printed circuit board that includes said extra pin.

6. The method of claim 5, wherein said removing comprises beveling along an edge of said printed circuit board.

7. The method of claim 5, wherein at least one of the one or more connectors are substantially PCI-express specification compliant after removing said portion of said printed circuit board that includes said extra pin.

8. The method of claim 5, wherein said printed circuit board following manufacturing comprises a graphics card.

9. A method of manufacturing a printed circuit board comprising:

forming one or more substrate layers;

forming one or more printed circuit layouts on said one or more substrate layers;

forming one or more connectors on said one or more substrate layers, wherein at least one of said one or more connectors is electrically coupled to at least one of said one or more printed circuit layouts; said at least one connector including an extra pin extending beyond an outer shape of said printed circuit board following manufacturing;

applying electrical energy to said extra pin so as to deposit a metal surface upon a portion of said at least one connector, and wherein said applying electrical energy to said extra pin so as to deposit a metal surface upon a portion of said at least one connector comprises electroplating said portion of said at least one connector.

10. The method of claim 9, wherein electroplating comprises electroplating a metal surface to an approximately particular thickness.

11. The method of claim 10, wherein said metal comprises gold and said approximately particular thickness comprises approximately 30 micro-inches.

12. The method of claim 9, wherein the electroplating comprises gold electroplating.

13. The method of claim 9, wherein said printed circuit board following manufacturing comprises a graphics card.

* * * * *